US010374411B2

(12) United States Patent
Mattos et al.

(10) Patent No.: US 10,374,411 B2
(45) **Date of Patent: *Aug. 6, 2019**

(54) ADJUSTABLE OVER-CURRENT DETECTOR CIRCUIT FOR UNIVERSAL SERIAL BUS (USB) DEVICES

(71) Applicant: Cypress Semiconductor Corporation, San Jose, CA (US)

(72) Inventors: Derwin W. Mattos, San Mateo, CA (US); Arnab Chakraborty, Bangalore (IN); Ramakrishna Venigalla, Bangalore (IN); Gerard Kato, San Jose, CA (US); Vaidyanathan Varsha, Milpitas, CA (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/873,248

(22) Filed: Jan. 17, 2018

(65) Prior Publication Data

US 2018/0191148 A1 Jul. 5, 2018

Related U.S. Application Data

(63) Continuation of application No. 15/280,729, filed on Sep. 29, 2016, now Pat. No. 9,899,825.
(Continued)

(51) Int. Cl.
*H02H 3/00* (2006.01)
*H02H 3/08* (2006.01)
(Continued)

(52) U.S. Cl.
CPC ............... *H02H 3/08* (2013.01); *G01R 17/02* (2013.01); *G01R 19/165* (2013.01);
(Continued)

(58) Field of Classification Search
CPC ........................................................ H02H 3/08
See application file for complete search history.

(56) References Cited

U.S. PATENT DOCUMENTS 7,149,098 B1 12/2006 Chen
7,245,465 B2 7/2007 Hikita
(Continued)

FOREIGN PATENT DOCUMENTS

CA 2736459 4/2015

OTHER PUBLICATIONS

201664782S_SpecAbstractDrawings_03302017; 3 pages.
(Continued)

*Primary Examiner* — Stephen W Jackson

(57) ABSTRACT

In an example embodiment, a device comprises a gate driver and a current detector circuit. The gate driver is configured to be coupled to a power switch on the VBUS line of a USB connector. The current detector circuit is configured to be coupled to the VBUS line and comprises a current sense amplifier, a reference voltage generator circuit, and a comparator. The current sense amplifier is configured to receive a pair of input voltages and to output an indicator signal responsive to the input voltage difference. The reference voltage generator circuit comprises a digital-to-analog converter configured to generate a reference voltage signal based on a received voltage selector signal that is a binary input signal comprising multiple bit values. The comparator is configured to receive the indicator signal and the reference voltage signal and to output an interrupt signal responsive to the indicator signal exceeding the reference voltage signal.

20 Claims, 12 Drawing Sheets

Related U.S. Application Data

(60) Provisional application No. 62/351,789, filed on Jun. 17, 2016, provisional application No. 62/337,189, filed on May 16, 2016.

(51) Int. Cl.

| | |
|---|---|
| ***G01R 17/02*** | (2006.01) |
| ***G01R 19/165*** | (2006.01) |
| ***H02H 1/00*** | (2006.01) |
| ***H03K 3/0233*** | (2006.01) |
| ***H02H 3/087*** | (2006.01) |

(52) U.S. Cl.

CPC .......... *H02H 1/0007* (2013.01); *H02H 3/087* (2013.01); *H03K 3/02337* (2013.01)

(56) References Cited

U.S. PATENT DOCUMENTS

| | | | | |
|---|---|---|---|---|
| 7,619,477 | B2 | 11/2009 | Segarra | |
| 8,138,929 | B2 | 3/2012 | Yen et al. | |
| 8,737,024 | B2 | 5/2014 | Nanov | |
| 9,899,825 | B2 * | 2/2018 | Mattos | H02H 3/087 |
| 2007/0268642 | A1 | 11/2007 | Metayer et al. | |
| 2009/0260607 | A1 | 10/2009 | LaDuke et al. | |
| 2010/0164528 | A1 | 7/2010 | Rahman et al. | |
| 2015/0295488 | A1 | 10/2015 | Shen et al. | |
| 2016/0322834 | A1 | 11/2016 | Carpenter et al. | |

OTHER PUBLICATIONS

International Search Report for International Application No. PCT/US17/18062 dated Mar. 30, 2017; 7 pages.

Texas Instruments, TI Over-Current Detection Products, Single-Chip Over-Current Detection Solution, 2014, 4 pages.

USPTO Non-Final Rejection for U.S. Appl. No. 15/280,729 dated Feb. 3, 2017; 10 pages.

USPTO Non-Final Rejection for U.S. Appl. No. 15/280,729 dated Sep. 15, 2017; 12 pages.

USPTO Notice of Allowance for U.S. Appl. No. 15/280,729 dated Oct. 27, 2017; 8 pages.

USPTO Notice of Allowance for U.S. Appl. No. 15/280,729 dated Apr. 12, 2017; 4 pages.

Written Opinion of the International Searching Authority for International Application No. PCT/US17/18062 dated Mar. 30, 2017; 6 pages.

* cited by examiner

500

| atstcfg | | | | atstio | | | | Purpose | Modifies Mission Mode | Stage1 Operational | Stage2 Comparator Operational | Vrefin Pins Used | Trim Support | | | |
|---|---|---|---|---|---|---|---|---|---|---|---|---|---|---|---|---|
| | | | | [1] | | [0] | | | | | | | | | | |
| [3] | [2] | [1] | [0] | Direction | Node/State | Direction | Node/State | | | | | | Vlost_Trim | Av_E_Trim | Vref_E_Trim, Vref_sel | BW |
| 0 | 0 | 0 | 0 | - | High-Z | - | High-Z | Mission-mode. No DFT access | No | Yes | Yes | Yes | * | * | * | * |
| 0 | 0 | 0 | 1 | Output | stg2_in | Output | out2 | Stage 1 & Stage 2 output access during operation | No | Yes | Yes | Yes | * | * | * | * |
| 0 | 0 | 1 | 0 | Input | stg2_in | Output | comp_out | Stage 2 comparator characterization. Comparator put into Unity-Gain mode. | Yes | No | Yes | Yes | | | | |
| 0 | 0 | 1 | 1 | Input | stg2_in | Output | out2 | Stage 2 characterization. Out2 observed. | Yes | No | Yes | Yes | | | * | |
| 0 | 1 | 0 | 0 | Input | vref_gen_in | Output | vref | Override Vrefin pins, monitor internal vref_in and out_d | Yes | Yes | Yes | No | * | * | * | |
| 0 | 1 | 0 | 1 | Input | vref_gen_in | Input | stg2_in | Characterize stage 2, control vrefin and stg2_in, monitor out_d using mission mode system | Yes | No | Yes | No | | | * | |
| 0 | 1 | 1 | 0 | Output | vref | Output | vref_top | Used for Vref select block Trim with normal Vrefin inputs | No | Yes | Yes | Yes | * | * | * | * |
| 0 | 1 | 1 | 1 | Input | vref_gen_in | Output | vref_top | Characterize and trim vref select block in isolation | Yes | No | No | No | * | * | * | * |
| 1 | 0 | 0 | 0 | Output | vref | Output | High-Z | Vref monitor on atstio[1] | No | Yes | Yes | Yes | | | * | |
| 1 | 0 | 0 | 1 | Output | High-Z | Output | stg2_in | stg2_in monitor alone | No | Yes | Yes | Yes | * | * | * | * |
| 1 | 0 | 1 | 0 | Output | reserved | Output | stg2_in | reserved | No | Yes | Yes | Yes | * | * | * | * |
| 1 | 0 | 1 | 1 | Output | reserved | Output | High-Z | reserved | No | Yes | Yes | Yes | | | | |
| 1 | 1 | 0 | 0 | Output | High-Z | Output | reserved | reserved | No | Yes | Yes | Yes | | | | |
| 1 | 1 | 0 | 1 | Output | stg2_in | Output | reserved | reserved | No | Yes | Yes | Yes | * | * | * | * |
| 1 | 1 | 1 | 0 | Output | stg2_in | Output | High-Z | stg2_in monitor alone | No | Yes | Yes | Yes | * | * | * | * |
| 1 | 1 | 1 | 1 | Output | High-Z | Output | vref | Vref monitor on atstio[0] | No | Yes | Yes | Yes | | | * | |

| Input Accuracy | | | | | | | | Stage1 Accuracy | | | | | | | | | Stage2 Accuracy | | | | | | | Total Error | |
|---|---|---|---|---|---|---|---|---|---|---|---|---|---|---|---|---|---|---|---|---|---|---|---|---|---|
| Leakage | Rsense | R_e | Vsense | | | SubTotal Error | | Vios1 | Vios1_e | Av | Av_e | Vout | | | SubTotal Error | | Vref | Vref_e | | Vios2 | Vios2_e | SubTotal Error | | | |
| | | | Min | Nom | Max | Min | Max | | | | | Min | Nom | Max | Min | Max | | | | | | Min | Max | Min | Max |
| uA | mΩ | % | mV | mV | mV | % | % | mV | % | V/V | % | V | V | V | % | % | V | mV | % | mV | % | % | % | % | % |
| 100 | 10 | 1 | 14.8 | 15 | 15.1 | -1 | 1 | 1 | 6.7 | 80 | 0.59 | 1.11 | 1.20 | 1.29 | -7.22 | 7.30 | 1.20 | 60 | 5.00 | 10 | 0.83 | -5.8 | 5.8 | -13.1 | 13.1 |
| 100 | 10 | 1 | 14.8 | 15 | 15.1 | -1 | 1 | 1 | 6.7 | 100 | 0.99 | 1.39 | 1.50 | 1.62 | -7.59 | 7.72 | 1.50 | 75 | 5.00 | 10 | 0.67 | -5.7 | 5.7 | -13.3 | 13.4 |
| 100 | 45 | 1 | 66.8 | 67 | 68.2 | -1 | 1 | 1 | 1.5 | 20 | 1.31 | 1.31 | 1.35 | 1.39 | -2.77 | 2.81 | 1.35 | 67 | 5.00 | 10 | 0.74 | -5.7 | 5.7 | -8.5 | 6.6 |
| 100 | 50 | 1 | 74.2 | 75 | 75.7 | -1 | 1 | 1 | 1.3 | 20 | 1.31 | 1.46 | 1.50 | 1.54 | -2.63 | 2.66 | 1.50 | 75 | 5.00 | 10 | 0.67 | -5.7 | 5.7 | -8.3 | 8.3 |
| | | | | | | | | | | | | | | | | | | | | | | | | | |
| 100 | 20 | 1 | 39.6 | 40 | 40.4 | -1 | 1 | 1 | 2.5 | 30 | 0.99 | 1.16 | 1.20 | 1.24 | -3.47 | 3.51 | 1.20 | 60 | 5.00 | 10 | 0.83 | -5.8 | 5.8 | -9.3 | 9.3 |
| 100 | 20 | 1 | 39.6 | 40 | 40.4 | -1 | 1 | 1 | 2.5 | 40 | 0.75 | 1.55 | 1.60 | 1.65 | -3.23 | 3.27 | 1.60 | 80 | 5.00 | 10 | 0.63 | -5.6 | 5.6 | -8.9 | 8.9 |
| 100 | 30 | 1 | 59.4 | 60 | 60.6 | -1 | 1 | 1 | 1.7 | 20 | 1.32 | 1.16 | 1.20 | 1.24 | -2.95 | 3.00 | 1.20 | 60 | 5.00 | 10 | 0.83 | -5.8 | 5.8 | -8.8 | 8.8 |
| 100 | 30 | 1 | 59.4 | 60 | 60.6 | -1 | 1 | 1 | 1.7 | 30 | 0.99 | 1.75 | 1.80 | 1.85 | -2.64 | 2.67 | 1.80 | 90 | 5.00 | 10 | 0.56 | -5.6 | 5.6 | -8.2 | 6.2 |
| | | | | | | | | | | | | | | | | | | | | | | | | | |
| 100 | 10 | 1 | 29.7 | 30 | 30.3 | -1 | 1 | 1 | 3.3 | 40 | 0.75 | 1.15 | 1.20 | 1.25 | -4.06 | 4.11 | 1.20 | 60 | 5.00 | 10 | 0.83 | -5.8 | 5.8 | -9.9 | 9.9 |
| 100 | 10 | 1 | 29.7 | 30 | 30.3 | -1 | 1 | 1 | 3.3 | 50 | 0.59 | 1.44 | 1.50 | 1.56 | -3.90 | 3.94 | 1.50 | 75 | 5.00 | 10 | 0.67 | -5.7 | 5.7 | -9.6 | 9.6 |
| 100 | 15 | 1 | 44.5 | 45 | 45.4 | -1 | 1 | 1 | 2.2 | 30 | 0.99 | 1.31 | 1.35 | 1.39 | -3.19 | 3.23 | 1.35 | 67 | 5.00 | 10 | 0.74 | -5.7 | 5.7 | -8.9 | 9.0 |
| 100 | 15 | 1 | 44.5 | 45 | 45.4 | -1 | 1 | 1 | 2.2 | 40 | 0.75 | 1.75 | 1.80 | 1.85 | -2.96 | 2.99 | 1.80 | 90 | 5.00 | 10 | 0.56 | -5.6 | 5.6 | -8.5 | 8.5 |
| | | | | | | | | | | | | | | | | | | | | | | | | | |
| 100 | 15 | 1 | 74.1 | 75 | 75.7 | -1 | 1 | 1 | 1.3 | 20 | 1.31 | 1.46 | 1.50 | 1.54 | -2.63 | 2.66 | 1.50 | 75 | 5.00 | 10 | 0.67 | -5.7 | 5.7 | -8.3 | 8.3 |
| 100 | 25 | 1 | 123.7 | 125 | 126.2 | -1 | 1 | 1 | 0.8 | 10 | 1.71 | 1.22 | 1.25 | 1.28 | -2.50 | 2.52 | 1.25 | 62 | 5.00 | 10 | 0.80 | -5.8 | 5.8 | -8.3 | 8.3 |
| 100 | 30 | 1 | 148.5 | 150 | 151.5 | -1 | 1 | 1 | 0.7 | 10 | 1.71 | 1.46 | 1.50 | 1.54 | -2.37 | 2.39 | 1.50 | 75 | 5.00 | 10 | 0.67 | -5.7 | 5.7 | -8.0 | 8.1 |
| 100 | 35 | 1 | 173.2 | 175 | 176.7 | -1 | 1 | 1 | 0.6 | 10 | 1.71 | 1.71 | 1.75 | 1.79 | -2.27 | 2.29 | 1.75 | 87 | 5.00 | 10 | 0.57 | -5.6 | 5.6 | -7.8 | 7.9 |

FIGURE 7

ADJUSTABLE OVER-CURRENT DETECTOR CIRCUIT FOR UNIVERSAL SERIAL BUS (USB) DEVICES

RELATED APPLICATIONS

This application is a Continuation of U.S. patent application Ser. No. 15/280,729, filed on Sep. 29, 2016, which claims the benefit of U.S. Provisional Application No. 62/337,189 filed on May 16, 2016, and of U.S. Provisional Application No. 62/351,789 filed on Jun. 17, 2016, all of which are hereby incorporated by reference herein in their entirety.

TECHNICAL FIELD

This disclosure relates to the field of over-current detection and, in particular, to a post-production, adjustable over-current detector circuit.

BACKGROUND

Circuitry connected to sources of power may sometimes be protected from over-current or over-voltage supply of that power with an over-current detector circuit. The over-current detector circuit may detect an over-current condition and issue an interrupt signal to disconnect the power source from the circuitry.

BRIEF DESCRIPTION OF THE DRAWINGS

The present disclosure is illustrated by way of example, and not by way of limitation, in the figures of the accompanying drawings.

FIG. 5 is a data sheet of analog test access and control parameters of the an analog design for test pin (ADFT) circuit of the system of FIGS. 1 and 3, according to one embodiment.

FIG. 7 illustrates a data sheet of stage one and stage two accuracies according to input accuracy, according to one embodiment.

DETAILED DESCRIPTION

Figure 1:
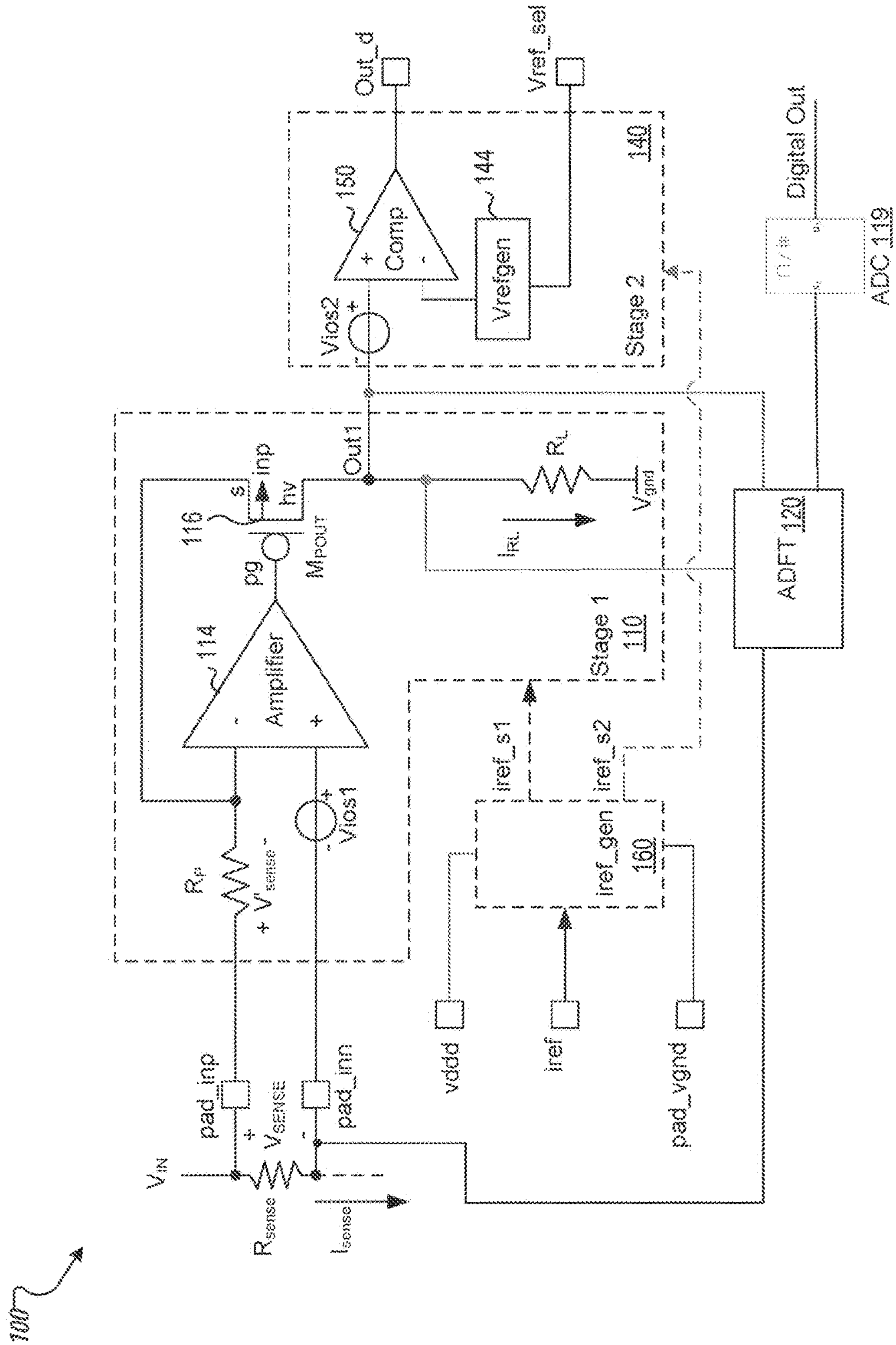
FIG. 1 is a block diagram illustrating an over-current detector circuit, according to one embodiment.

Electronic devices, such as processing devices, consume electrical power. So do electrical components that may be a part of or interface with such processing devices, sometimes consuming power from a common voltage source. Such electrical components may include Universal Serial Bus (USB™) connector devices using technology developed by the USB Implementers Forum, Peripheral Component Interconnect (PCI)-based or PCI Express (PCIe®)-based connectors or interfaces employing technology of the PCI Special Interest Group, Power Programmable System-on-a-Chip (PowerPSoC™) made by Cypress Semiconductor of San Jose, Calif., and similar such components that may employ standards-based communication protocols. To protect sensitive circuitry connected by these electrical components from over-current conditions, an over-current detector circuit (OCD) may be employed, which itself may be a part of an over-current protection (OCP) device. Because of a wide range of current limits needed for connected devices in a variety of applications, desired is a post-production means for adjusting current limits that govern current levels the OCD detects, among other parameters.

In various embodiments, the OCD may employ a current sense amplifier (CSA) for power control and protection application. The CSA may be, in various embodiments, any current measuring or current detecting circuit. The CSA may be deployed to sense a current level and generate a voltage output to be compared with a reference voltage signal ($V_{ref}$) that may trigger an interrupt signal to disconnect a voltage source. Accordingly, the reference voltage signal is sometimes referred to as a trigger voltage ($V_{trig}$) in the art. CSAs are typically programmable mainly through external analog means. Discrete CSAs may offer high accuracy and low frequency performance while integrated CSAs (such as in LED applications) may offer high frequency and little-to-no accuracy or bandwidth adjustment capability. The disclosed OCD, however, may allow programming via external digital means and provide to customers the ability to make, post-production, power loss versus accuracy trade-offs in current protection detection.

In one embodiment, the disclosed OCD includes a current sense amplifier (CSA) to receive a pair of input voltages (e.g., from across a sense resistor) and to output a first indicator signal responsive to a sensed input voltage difference produced from an incoming current level across a sense resistor. The OCD may further include a comparator coupled to the current sense amplifier. The comparator may compare the first indicator signal to a reference voltage signal ($V_{ref}$) and output an interrupt signal responsive to the first indicator signal exceeding the reference voltage signal. The OCD may further include a reference voltage generator circuit coupled to the comparator. The reference voltage generator circuit may select the reference voltage signal from a plurality of reference voltages according to a reference voltage selector signal received from a configuration channel of a USB (or other type of) connector device. In one embodiment, the reference voltage generator circuit includes a digital-to-analog converter (DAC) to convert, from the plurality of reference voltages, the first selector signal to the reference voltage signal.

In an embodiment, the reference voltage generator circuit is further to generate the plurality of reference voltages based on an input reference signal that chooses between multiple source voltages. Accordingly, the OCD may further include an input reference circuit coupled to the reference voltage generator. The input reference circuit may select between multiple input reference signals, which correspond to multiple input source voltages, responsive to an input reference selector signal, to generate an input reference signal. The multiple input reference signals may include at least a low-power input voltage and a high-power input voltage, for example. The reference voltage selector signal and the input reference selector signal may, in one embodiment, be sent by an electrical device over the configuration channel during or post production for purposes of calibrating the OCD for a certain application and/or expected input current levels, among other operation conditions as will be explained in more detail.

The present OCD may provide flexibility in choice of the reference voltage signal ($V_{ref}$), which can range, for example, between about 1.3V and 1.9V, selectable post-production from up to 64 different reference voltages with a 10 mV step size, although additional or fewer reference voltage signal choices are envisioned. The combination of CSA gain and reference voltage adjustability provides a useable reference voltage signal that may trigger responsive to a sensed voltage ($V_{SENSE}$) between about 13 mV and 190 mV, for example. The functionality of the present OCD is not constrained to specific values provided herein, which are disclosed for explanatory purposes only.

Furthermore, the disclosed OCD may provide two modes of operation, including continuous and latched modes. For example, in a continuous mode, the CSA may measure a sensed voltage difference across the sense resistor, and the comparator may provide an output signal to continuously track the sensed voltage difference versus a voltage of the reference voltage signal. And, in the latched mode of operation, the comparator may activate a high level of hysteresis after the interrupt signal is output, to reset the comparator, upon detection that the sensed voltage exceeds a voltage of the reference voltage signal. In the continuous mode, the reference to the comparator, $V_{ref}$, may be fixed at all times. In the one latched mode, however, $V_{ref}$ may be changed to a lower voltage value once the output of the comparator goes high. The original voltage of $V_{ref}$ can then be re-instated when the input voltage is below this lower $V_{ref}$ voltage. In this way, $V_{ref}$ is switched to provide different trigger thresholds for rising and falling transitions of the input signal.

In one embodiment, the OCD may also include an analog-to-digital converter (ADC) to record $V_{SENSE}$ at the moment the comparator outputs the interrupt signal, and thus provide the sensed voltage as a digital output. The ADC may also be used as an over-protection detector implemented at chip or system level, with the addition of software control as will be explained in more detail.

FIG. 1 is a block diagram illustrating an over-current detector circuit (OCD) 100, according to one embodiment. The OCD 100 of FIG. 1 may include a first stage 110, an analog-to-digital (ADC) converter, an analog design for test pin (ADFT) circuit 120 coupled to the first stage 110, a second stage 140 coupled to the first stage 110, and an input reference current generator 160 coupled to the first stage 110 and the second stage 140.

In one embodiment, the first stage 110 further includes a current sense amplifier (CSA) 114 coupled to a metal-oxide semiconductor field-effect transistor (MOSFET) 116 (or the like), to which an output resistor ($R_L$) is coupled. The CSA 114 may be, in various embodiments, any current measuring or current detecting circuit. The current to be sensed ($I_{sense}$) passes through a sense resistor ($R_{sense}$), and a voltage difference on either side of the sense resistor is sensed across the sense resistor as $V_{SENSE}$. The CSA 114 translates an elevated differential signal across input signals pad_inp and pad_inn (taken on either side of $R_{sense}$) to a grounded, first indicator signal (Out1). The first stage 110 operates by reproducing the $V_{SENSE}$ voltage as $V'_{sense}$ across resistor $R_P$, and sending the resulting current, $I_L$, across resistor $R_L$. The DC output gain may be expressed as the ratio of $R_L/R_P$ and the first indicator signal at Out1 may be expressed as follows:

$$V_{out1} = \left(\frac{R_L}{R_P}\right)V_{sense} = \left(\frac{R_L}{R_P}\right)(V_{inp} - V_{inn}) \quad \text{Equation (1)}$$

The CSA 114 may further include a first stage input offset voltage (Vios1) (at an input of the CSA 114), e.g., near the positive pad input voltage (pad_inn). The first stage input offset voltage will be discussed later on with reference to FIGS. 9B and 9C.

In one embodiment, the second stage 140 further includes a comparator 150 and a reference voltage generator circuit ($V_{refgen}$) 144. The comparator 150 may compare a voltage of the first indicator signal ($V_{Out1}$) to a reference voltage signal ($V_{ref}$), also known in the art as a trigger voltage, and output an interrupt signal (Out_d) when the first indicator signal exceeds the reference voltage signal. Although the first indicator signal is not a primary output signal, a value of $V_{Out1}$ may be accessible through the ADFT circuit 120 interface. Furthermore, the comparator 150 may provide a second stage input offset voltage ($V_{ios2}$), e.g., at a positive input to the comparator 150. The second stage input offset voltage will be discussed later with reference to FIGS. 9B and 9C.

Figure 8:
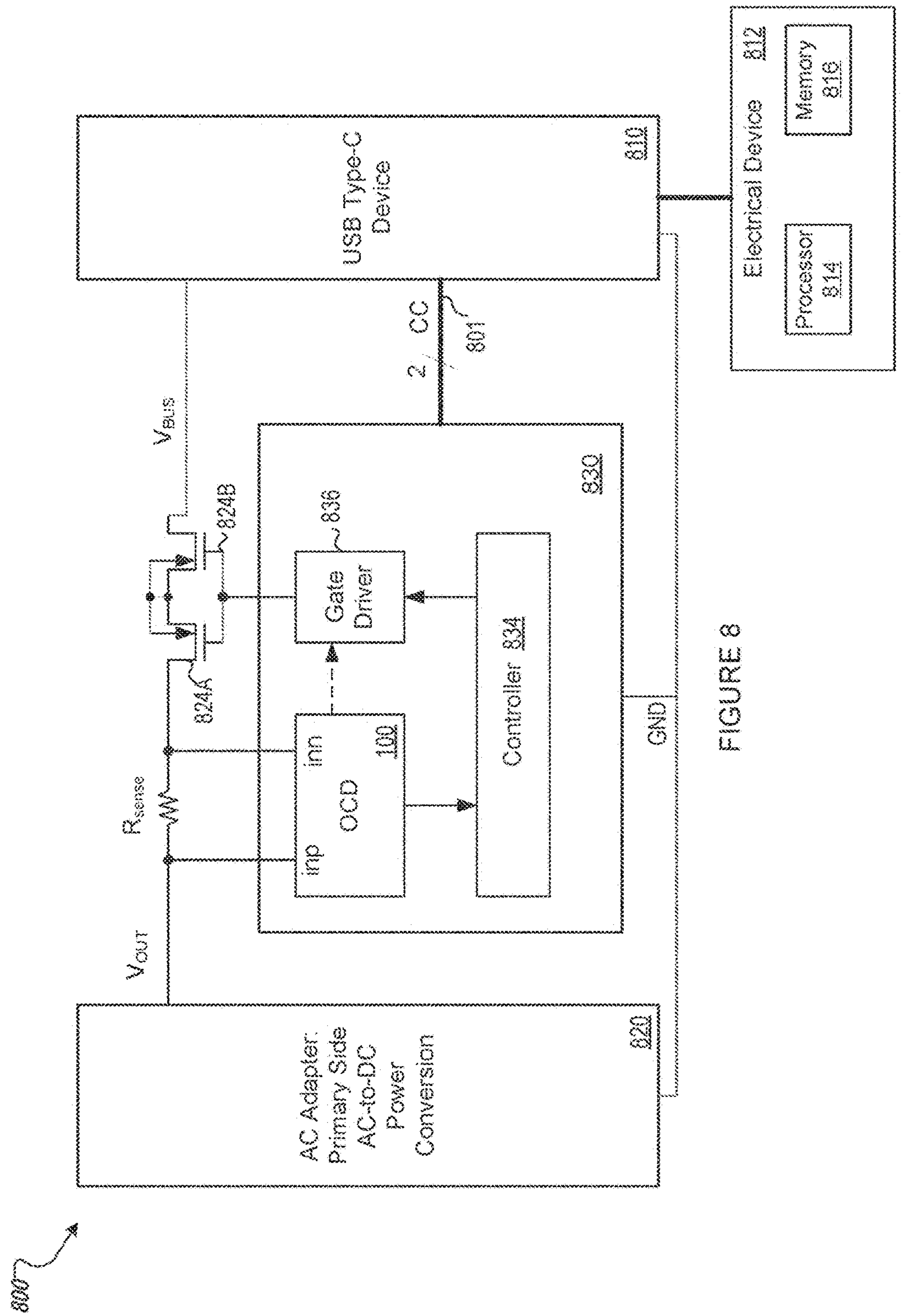
FIG. 8 is a block diagram of a system in which a current-sense detector circuit is employed in context of a Universal Serial Bus (USB) connector device, according to one embodiment.

In one embodiment, the reference voltage generator circuit 144 may be coupled to the comparator 150 and may select the reference voltage signal from a plurality of reference voltages according to a reference voltage selector (Vref_sel) signal received from a communication channel of an electrical component such as from a configuration channel of a USB connector device (FIG. 8).

In an embodiment, the input reference current generator 160 may be coupled to the first stage 110, to receive an on-chip system reference current ($I_{re}f$) and produce a first bias current (iref_s1) used to activate the first stage 110 and produce a second bias current (iref_s2) to activate the second stage 140.

The OCD 100 may further provide two modes of operation, including continuous and latched modes. For example, in a continuous mode, the CSA 114 may measure $V_{SENSE}$ across the sense resistor, and the comparator may provide an output signal to continuously track the sensed voltage versus a voltage of the $V_{ref}$ signal.

Additionally, in the latched mode of operation, the comparator 150 may activate a high level of hysteresis after the interrupt signal is output, to reset the comparator, upon detection that the $V_{SENSE}$ exceeds a voltage of $V_{ref}$. In the continuous mode, the reference to the comparator, $V_{ref}$, may be fixed at all times. In the one shot mode, however, $V_{ref}$ is changed to a lower voltage value once the output of the comparator goes high. The original voltage of $V_{ref}$ can then be re-instated when the input voltage is below this lower $V_{ref}$ voltage. In this way, $V_{ref}$ is switched to provide different trigger thresholds for rising and falling transitions of the input signal.

In one embodiment, the OCD 100 may also include the analog-to-digital converter (ADC) 119 to record $V_{SENSE}$ at the moment the comparator 150 outputs the interrupt signal, and thus provide the $V_{SENSE}$ as a digital output. More specifically, the ADC 119 may be coupled to the ADFT 120 through which to receive the Out1 of the CSA 114, which is also the input to the comparator 150. The ADC 119 may provide a digital indicator of an analog output signal to track the sensed voltage difference ($V_{SENSE}$). The ADC may also be used as an over-protection detector implemented at chip or system level, with the addition of software control as will be explained in more detail.

Figure 2A:
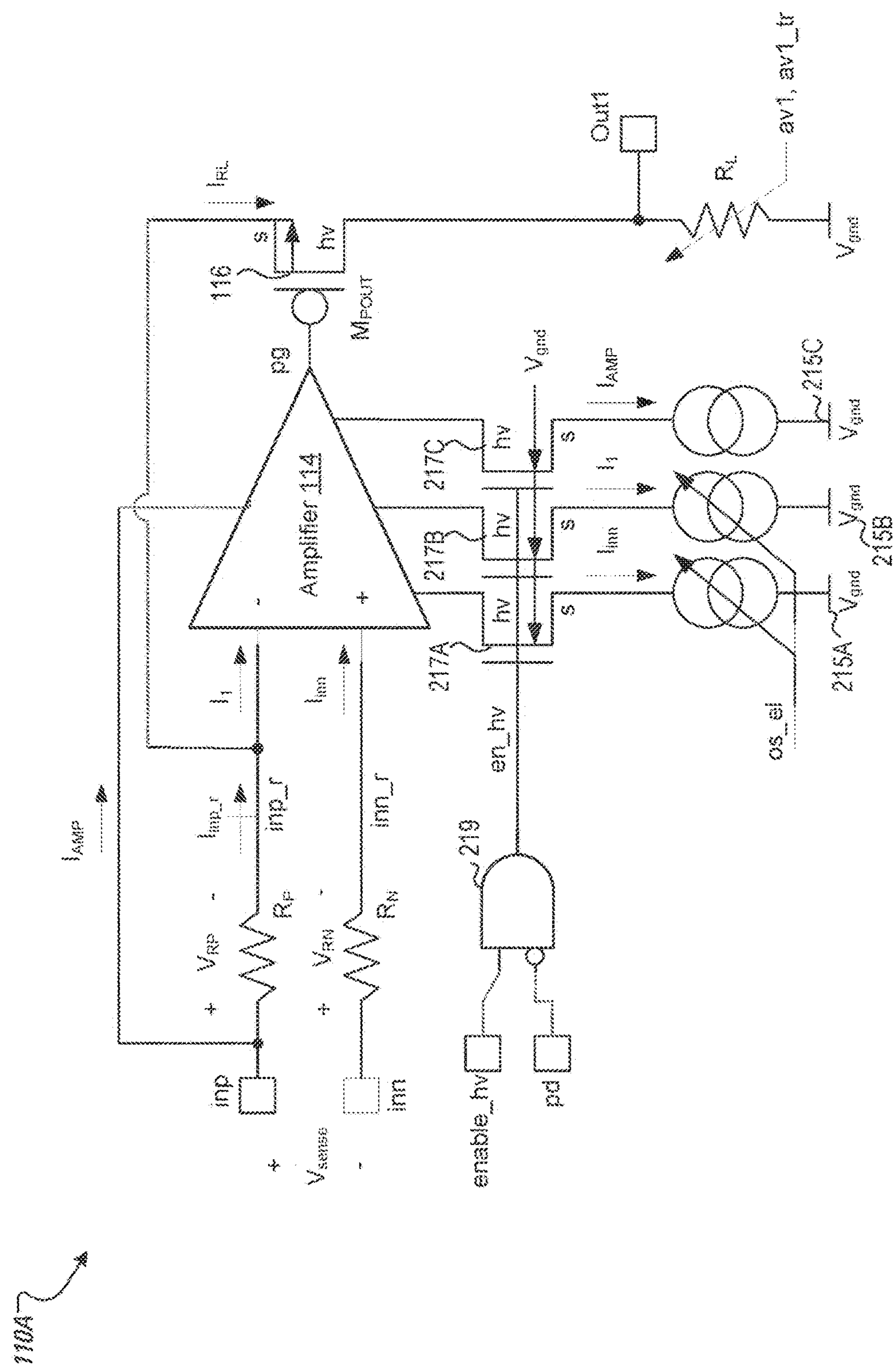
FIG. 2A illustrates a first stage of the over-current detector circuit of FIG. 1, according to one embodiment.

FIG. 2A illustrates a first stage 110A of the over-current detector circuit 100 of FIG. 1 with additional detail, according to one embodiment. The features already discussed with reference to FIG. 1 will not be repeated here. In one embodiment, the CSA 114 is a current difference amplifier that performs amplification at the pg signal, where the CSA 114 is biased by ground reference current sources 215A, 215B, 215C, to enforce that $I_1=I_{inn}$, and via a feedback connection from the source of MOSFET 116 to the resistor ($R_p$), to enforce that $V_+$ is equal to $V_-$. In one embodiment, the first ground reference current source 215A and the second ground reference current source 215B are adjustable. When the $V_{SENSE}$ is greater than zero, the additional current needed to maintain $V_+$ equal to $V_-$ is delivered to the $R_L$ as $I_{RL}$. As $I_{RL}$ passes through both $R_P$ and $R_L$, the output voltage gain is defined by Equation (1). The first stage 110A may further include three power MOSFETs 217A, 217B, and 217C through which the biased ground reference current sources 215A, 215B, and 215C may draw their respective currents.

The first stage 110 may further provide trim capability in at least a pair of programmable signals. One of the programmable signals may be an elevated input offset trim signal (os_el), which adjusts the stage one input offset voltage ($V_{ios1}$). The elevated input offset trim signal may adjust one or both of the biased ground reference current sources 215A and 215B, to provide variable selection of the stage one input offset voltage, $V_{ios1}$, which is shown in FIG. 1. When activated, the elevated offset trim may function in a binary-weighted fashion, where bit zero ("0") represents a single step and bit one ("1") is twice as large. Table 1 below summarizes the elevated input offset voltage (os_el) functionality.

TABLE 1

| os_el | | |
|---|---|---|
| [3] | [2:0] | Result |
| 0 | 0 | Trim is not activated |
| 0 | N | −N*Vios1_Trim_Step |
| 1 | 0 | Trim is not activated |
| 1 | N | +N*Vios1_Trim_Step |

The first stage 110A may further provide trim capability with the ability to set a nominal gain through an input control bus, av1, which may carry a gain trim signal (av1_tr), another of the at least two programmable signals. The gain trim signal may adjust the resistance of resistor $R_L$, thus adjusting the gain ($R_L/R_P$) of the CSA 114. The gain trim signal (av1_tr) may be controlled as show in Table 2 below.

TABLE 2

| av1_tr | | |
|---|---|---|
| [3] | [2:0] | Result |
| 0 | 0 | Trim is not activated |
| 0 | N | −N*Av_Trim_Step |
| 1 | 0 | Trim is not activated |
| 1 | N | +N*Av_Trim_Step |

In one embodiment, the first stage 110A may include an AND gate 219 to set an enable signal (en_hv) at gates of the MOSFETs 217A, 217B, 217C in response to an input enable signal (enable_hv) and the absence of an input power down (pd) signal. The power down (pd) signal serves to disable the circuit when set to a logic HIGH value.

Figure 2B:
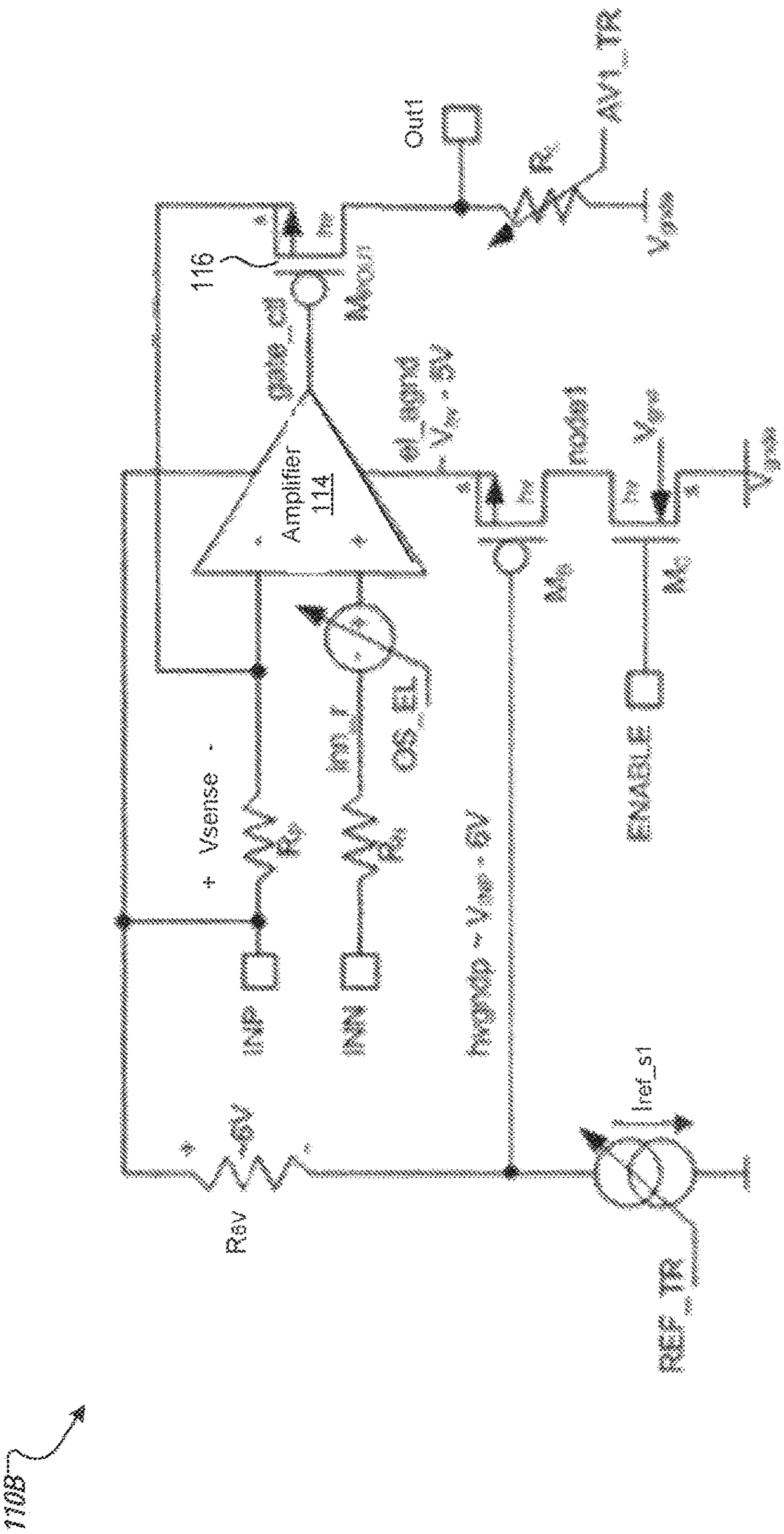
FIG. 2B illustrates the first stage of the over-current detector circuit of FIG. 1, according to another embodiment.

FIG. 2B illustrates a first stage 110B of the over-current detector circuit 100 of FIG. 1, according to another embodiment. The features already discussed with reference to FIGS. 1 and 2A will not be repeated here. The first stage 110B may further use an elevated power supply defined by INP and an elevated-above-ground signal (el_agnd). The elevated power may be provided across a resistor ($R_{6V}$) that can drop 4V to 6V six volts. The $R_{6V}$ resistor may be coupled between the CSA 114 and a first of two additional MOSFETS, $M_B$. The second of the two additional MOSFETs, $M_C$, may be serially connected to MOSFET $M_B$ to ground, and be driven by a first stage enable signal. The first stage 110B embodiment of FIG. 2B may also provide trim capability with an input current trim (REF_TR) to adjust the amount of current ($I_{ref\_s1}$) passing through the $R_{6V}$ resistor. The first stage 110B may also provide the input offset trim signal (os_el) as a variable input offset voltage, similarly as provided in the first stage 110A of FIG. 2A.

Figure 3:
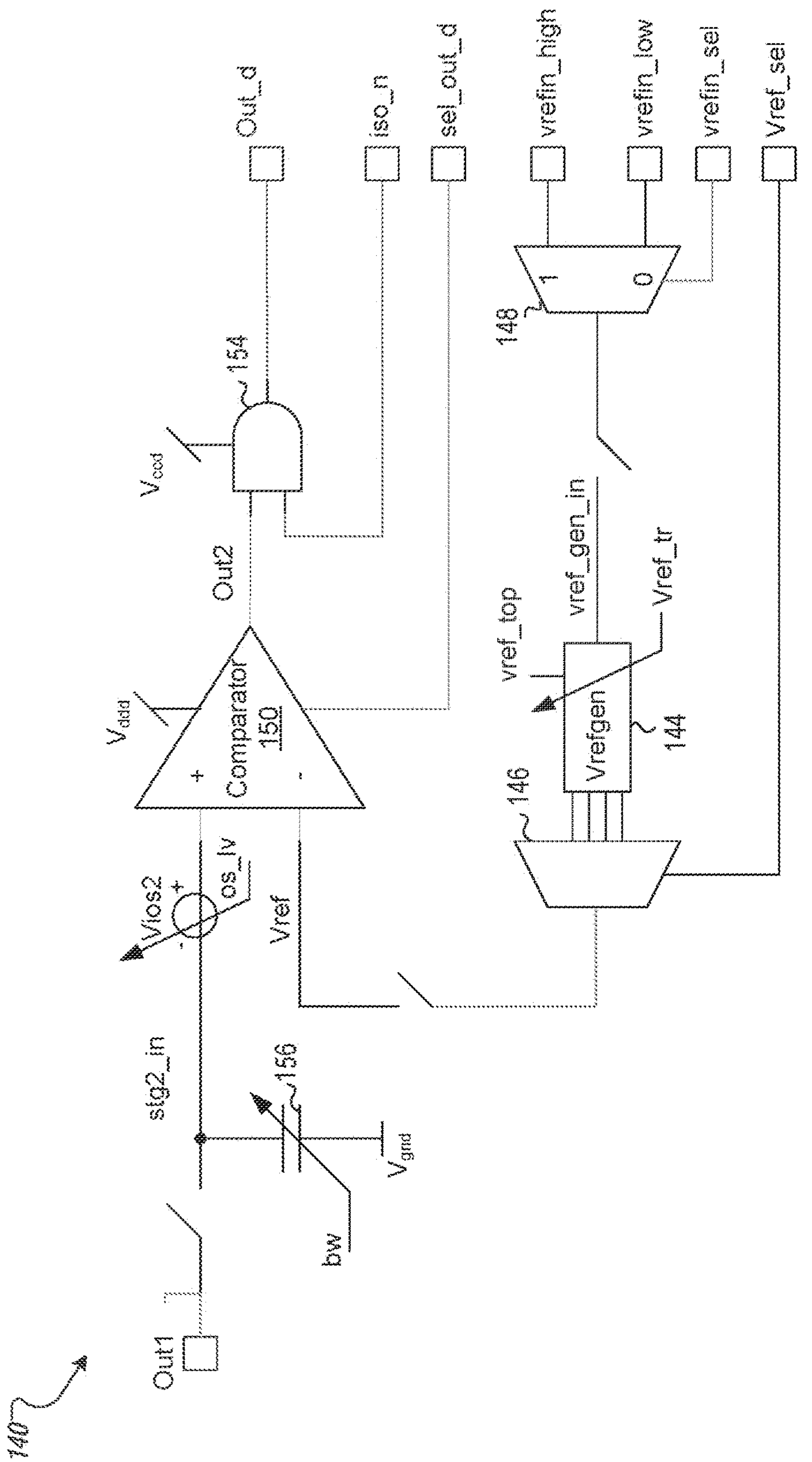
FIG. 3 illustrates a second stage of the over-current detector circuit of FIG. 1, according to one embodiment.

FIG. 3 illustrates a second stage 140 of the over-current detector circuit 100 of FIG. 1, according to one embodiment. The features already discussed with reference to FIG. 1 may not be fully repeated here. As discussed, when the stage one output (Out1) exceeds the reference voltage signal (Vref), the comparator 150 triggers an output, Out2. The second stage 140 may further include an AND gate 154 coupled to an output of the comparator 150. The AND gate 154 may combine the output of the comparator 150 (out2) to an input isolation signal (iso_n) to generate the interrupt signal (Out_d). The iso_n signal serves to prevent a floating signal from being delivered to the chip core circuitry when the OCD circuit power supplies are not valid.

In one embodiment, the second stage 140 also provides programmability features in which external digital signals may trigger changes in input source voltage and the input reference voltage ($V_{ref}$), among other parameters, for purposes of post-production trim and calibration. For example, the second stage 140 may further include an adjustable capacitor 156 coupled to the output of the CSA 114. The adjustable capacitor 156 may adjust an input capacitance in response to a bandwidth trim signal (bw), to selectively remove high frequency power supply noise. This bandwidth trim signal will be discussed in more detail below. Furthermore, the input offset voltage ($V_{ios2}$) may be selectably adjusted using a low input offset trim signal (os_lv).

Furthermore, the second stage 140 may include an input reference circuit 148 (e.g., a multiplexer, for example) coupled to the reference voltage generator circuit ($V_{refgen}$) 144. The input reference circuit 148 may select between multiple input reference signals that correspond to multiple input source voltages in response to an input reference selector signal (vrefin_sel). The input reference selector signal may also be sent over a configuration channel of a connector device such as a USB connector device in one embodiment. The multiple input source voltages may include at least a high voltage (vrefin_high) and at least a low voltage (vrefin_low). For example, in one embodiment, the high voltage is 1.2V and the low voltage is 0.74V. Additional or different input source voltages are envisioned.

Accordingly, the selected input reference signal that the input reference circuit 148 may select is sent as a reference voltage generator input (vref_gen_in) to the reference voltage generator circuit 144. The selected input reference signal may be a high or low source voltage. In one embodiment, the reference voltage generator circuit 144 may use the selected high or low reference voltage to generate up to a particular number of different reference voltages (such as 64 or 256, for example) for selection as the reference voltage signal (Vref). In one embodiment, a voltage trim signal (Vref_tr), when activated, may perform a voltage trim on the plurality of reference voltages available for selection by the reference voltage generator circuit 144, to perform further calibration in obtaining a high level of accuracy in the reference voltage signal that is sent as a voltage trigger to the comparator 150. A summary of the voltage trim signal ($V_{ref\_tr}$) functionality is included in Table 3 below.

TABLE 3

| vref_tr | | |
|---|---|---|
| [3] | [2:0] | Result |
| 0 | 0 | Trim is not activated |
| 0 | N | −N*Vref_Trim_Step |
| 1 | 0 | Trim is not activated |
| 1 | N | +N*Vref_Trim_Step |

The reference voltage generator circuit 144 may further include a multiplexer 146 to receive as inputs the plurality of reference voltages, and select one of the reference voltages in response to the reference voltage selector signal ($V_{ref\_sel}$). The reference voltage selection signal may be, for example, a 6-bit signal (for 64 reference voltages) or an 8-bit signal (for 256 reference voltages), depending on the number of reference voltages available. With 64 steps, the Vref range may be between 1.3V to 1.93V with 10 mV steps sizes as shown in Table 4. Different voltage steps sizes are envisioned, and these particular values are provided by way of example only.

TABLE 4

| vref_tr | Result |
|---|---|
| 0 | 1.3 V |
| N | 1.3 V + N*10 mV |

The reference voltage generator circuit 144 and the multiplexer 146 may also be implemented with a digital-to-analog converter (DAC), which may generate the reference voltage signal ($V_{ref}$) at an output of the DAC based on the reference voltage selector signal ($V_{ref\_sel}$), where $V_{ref\_sel}$ is a binary input signal. The DAC may be designed in a number of ways. For example, FIGS. 4A, 4B, 4C, 4D, 4E illustrate a DAC included as implementation of the reference voltage generator circuit 144 and the multiplexer 146 of FIG. 3, according to various embodiments.

Figure 4B:
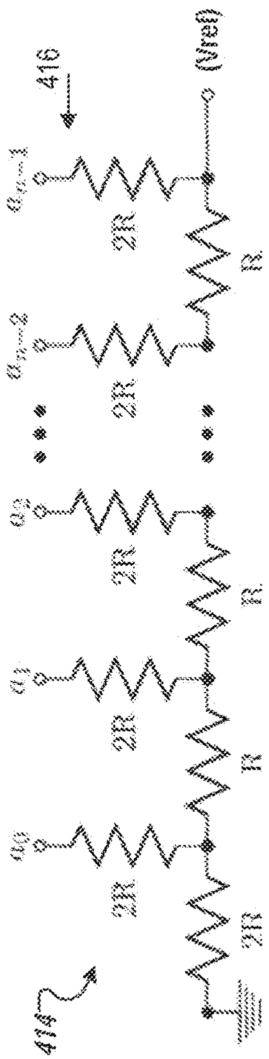
FIGS. 4A, 4B, 4C, 4D, 4E illustrate a digital-to-analog converter (DAC) included as implementation of at least the reference voltage generator circuit of FIGS. 1 and 3, according to various embodiments.
Figure 4D:
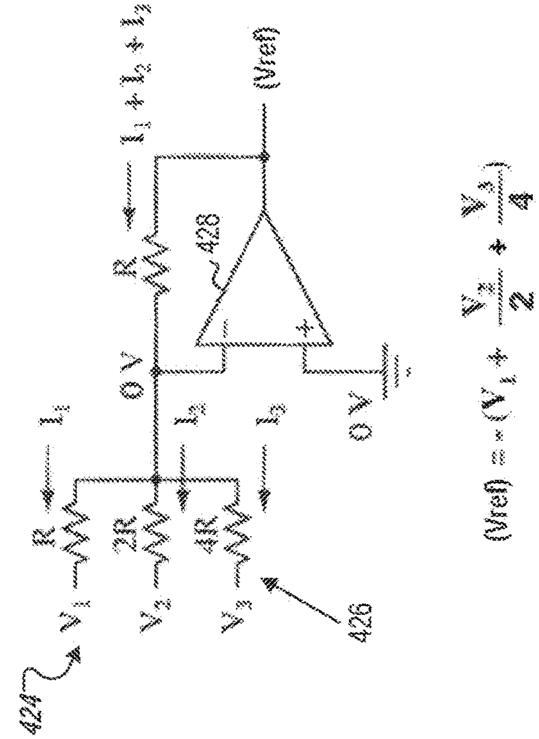
Figure 4A:
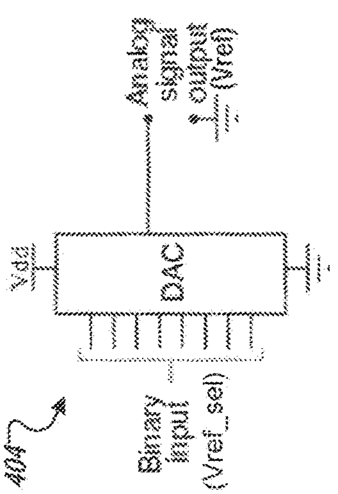

According to a first embodiment, illustrated in FIG. 4A, a DAC 404 may include a binary input, which in this example is the reference voltage selector signal ($V_{ref\_sel}$), and may generate an analog signal output ($V_{ref}$). The DAC 404 may generate the reference voltage signal ($V_{ref}$) to correspond to any of a plurality of possible reference voltages in response the reference voltage selector signal, which acts as an input to the DAC 404. This is the general functioning of each DAC, which are described below in more detail.

According to a second embodiment, illustrated in FIG. 4B, a DAC 414 may include a bank of voltage dividers 416, each connected to a binary signal ($a_0$, $a_1$, $a_2$, . . . $a_{n-2}$, $a_{n-1}$). The binary signals that are asserted based on the incoming reference voltage selector signal may dictate which voltage dividers are activated and produce a combination of voltage drops that add up to the reference voltage signal ($V_{ref}$).

Figure 4C:
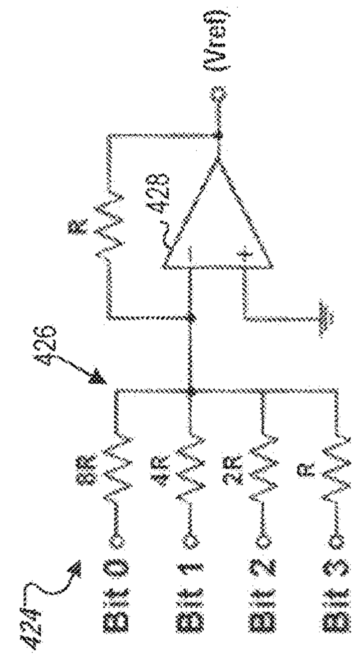
Figure 4E:
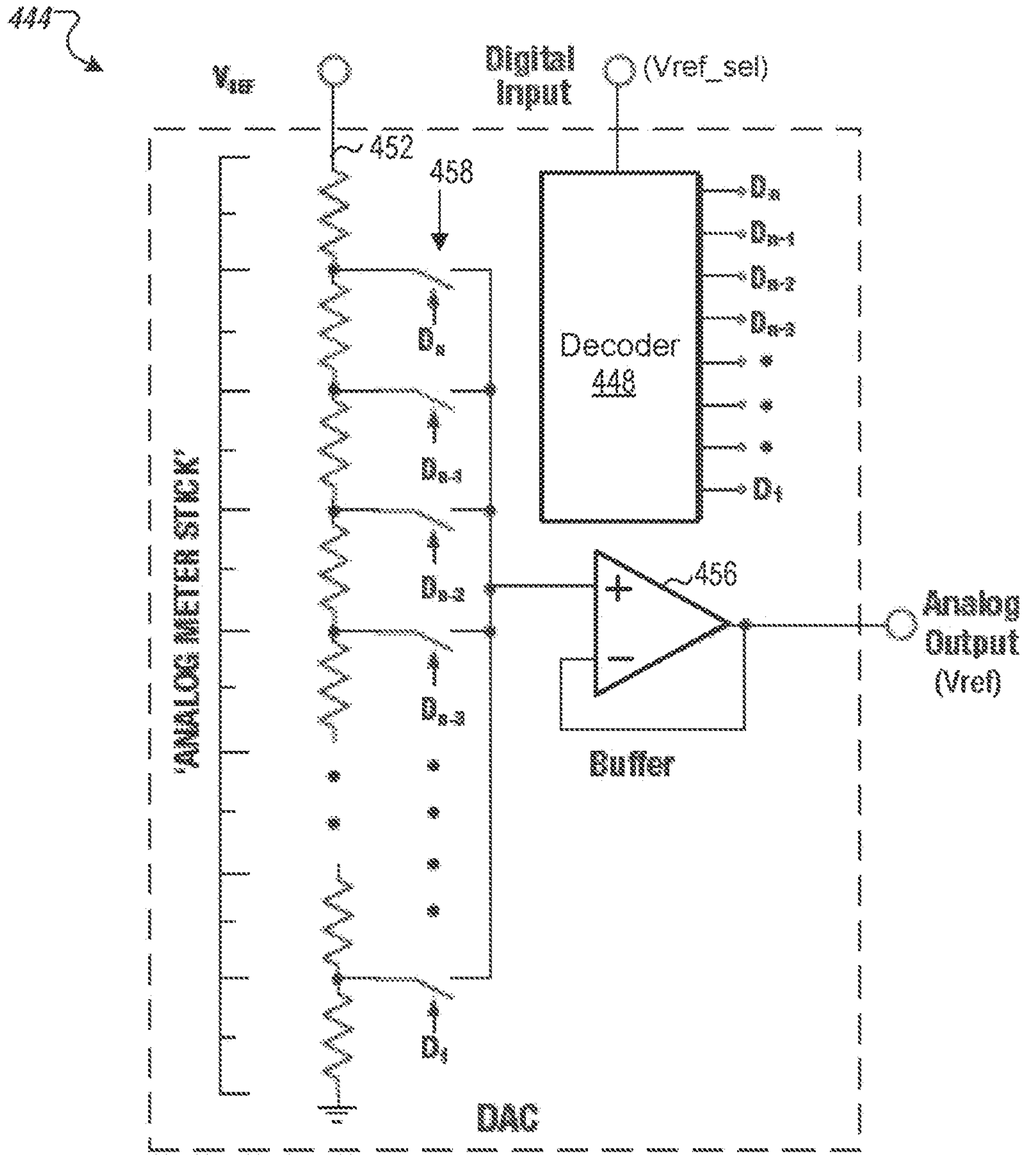

According to a third embodiment, illustrated in FIGS. 4C and 4D, a DAC 424 may include a bank of resistors 426 of varying resistance. The DAC 424 may select resistors from the bank of resistors 426 based on incoming bits of the reference voltage selector signal ($V_{ref\_sel}$). The DAC 424 may further include an amplifier 428 coupled to the bank of resistors 426. The amplifier 428 may amplify a sum of voltage drops across the asserted resistors of the bank of resistors 426, to output the reference voltage signal ($V_{ref}$). FIG. 4D is an illustration of how Vref is calculated when the DAC 424 of FIG. 4C includes a first voltage ($V_1$) at Bit 3, a second voltage ($V_2$) at Bit 2, a third voltage ($V_3$) at bit 1, and no voltage at Bit 0, corresponding to the incoming bits of the reference voltage selector signal. In one embodiment, the voltages $V_1$, $V_2$, and $V_3$ may correspond to different input source voltages.

According to a fourth embodiment, illustrated in FIG. 4D, a DAC 444 may include a series of resistors 452 to provide an increasing number of voltage drops that may be added by way of a decoder 448. The decoder 448 may receive a digital input, which in this example may be the reference voltage selector signal ($V_{ref\_sel}$), and output a further signal to close any number of switches 458, which add in corresponding voltage drops of the series of resistors 452. The sum of these voltage drops may then be buffered in a buffer 456 coupled between switches of the series of resistors 452 and an analog output, e.g., the reference voltage signal, $V_{ref}$.

With further reference to FIG. 1, the analog design for test pin (ADFT) circuit 120 may include a two-wire analog bus connected to pins and internal circuit nodes that are labeled in FIGS. 1, 2A, 2B, and 3. Accordingly, the ADFT circuit 120 may facilitate performing measurements and obtaining voltage and gain values of the OCD 100 at various locations so that adjustments and trim operations may be performed. For example, the ADFT circuit 120 may measure the first stage voltage offset ($V_{ios1}$), the second stage voltage offset ($V_{ios2}$), and the gain value ($A_V$) for the CSA 114 of the first stage 110. These values may be used in determining how to change the reference voltage selector signal ($V_{ref\_sel}$) to adjust the reference voltage signal for further calibrations as will be discussed in more detail with reference to FIGS. 9B and 9C. Relatedly, the ADFT circuit 120 may connect the voltage output (vref_top) of the reference voltage generator circuit 144. The vref_tr can be used to adjust vref_top, which helps to ensure accuracy of the reference voltage, $V_{ref}$. Furthermore, $V_{ref\_sel}$ can be used also to ensure Vref selections are accurate.

FIG. 5 is a data sheet 500 of analog test access and control parameters of the OCD 100 of FIGS. 1 and 3, showing the connectivity of the ADFT circuit 120 according to one embodiment. Not all entries of the data sheet 500 are pertinent to the present discussion. The analog test configuration signal, atstcfg, which is the first set of four columns starting from the left of the data sheet, is a 4-bit control word within a system register (not shown) that directs ADFT circuit connectivity according to different operating states and measuring modes. This 4-bit control word controls an analog test I/O signal (atstio[1:0]).

The analog test signal, a second set of four columns, includes the two ADFT circuit pin names, e.g., atstio[1] and atstio[0]. These analog test signal pins, which are independent chip-level pins, may be mapped to a chip system analog bus (not shown) as atstio[1] corresponding to amuxbus_a and atstio[0] corresponding to amuxbus_b. Note also that a few of the analog test signal states may deactivate the first stage 110 and/or the second stage 140 of the OCD 100, or put these stages into a power-down state when not in operation. Entries of the "Direction" columns state whether the pin is used as an input or output for that atstcfg setting. Entries of the "Node/State" columns indicate either the node that the analog test signal pin is connected to or a state of the pin if the pin is not connected or is in a high impedance state, e.g., high-Z.

The next column indicates a "Purpose" of the particular mode if selected using the atstcfg bits. The subsequent columns indicate whether features exist or not depending on the selected mode. For example, the term "mission-mode" means that the CSA 114 is operational in normal function (e.g., not in a test mode). In the "Modifies Mission Mode" column, a "No" means that the atstcfg setting does nothing to interrupt the mission-mode operation of the CSA circuit. When atstcfg is 0, 1, 6, or 8-15, the mission mode is allowed to operate. When atstcfg=1, the output of the first stage 110 (stg2_in) can be routed to a chip analog bus during mission-mode, where this signal can be picked up by a system ADC circuit (not shown) for use in comparison.

A combination of the bandwidth trim signal (bw) illustrated in FIG. 3 and the input control bus signal (av1) illustrated in FIG. 2A may be used to provide bandwidth adjustment capability and a nominal gain setting control. The bandwidth adjustment capability allows trade-offs in bandwidth, time delay, and power supply rejection ratio (PSRR). This adjustment uses two bits to choose between four possible bandwidth settings. Depending on the selection, capacitance is added or removed from the analog output of first stage 110, thereby increasing or decreasing the propagation delay. The higher the capacitance, the better the PSRR. The PSRR of the OCD 100 may be a measure of rejection of oscillation of a power supply signal. The bandwidth trim signal may control the capacitance load at stag2_in. Because the bandwidth trim signal is associated with the output of the first stage, the bandwidth trim signal may affect both of the output selection modes (sel_out_d=0, 1), where sel_out_d is to disable or enable the stage two output (Out_d). The bandwidth trim signal (bw) and the input control bus signal (av1) may be set as a pair to effect gain and bandwidth control as show in Table 5.

TABLE 5

| av1[2] | av1[1] | av1[0] | bw[1:0] | Nominal Gain |
|---|---|---|---|---|
| 0 | 0 | 0 | 0 | 10 (default) |
| 0 | 0 | 1 | 0 | 15 |
| 0 | 1 | 0 | 1 | 20 |
| 0 | 1 | 1 | 1 | 30 |
| 1 | 0 | 0 | 2 | 40 |
| 1 | 0 | 1 | 2 | 50 |
| 1 | 1 | 0 | 3 | 70 |
| 1 | 1 | 1 | 3 | 100 |

With further reference to FIGS. 1, 2A, 2B, and 3, the over-current detection of the OCD 100 provides the capability to adjust the $V_{SENSE}$ target to match an application's requirements, post production. A customer may do so by manipulating the OCP circuit DC gain, $A_V$, and the reference voltage, Vref, used to trigger a system interrupt, e.g., to generate the interrupt signal (Out_d). The input $V_{sense}$ signal may be amplified linearly to produce $V_{out1}$ as expressed in Equation (2).

$$V_{OUT1}=A_V V_{SENSE}=A_V(V_{INP}-V_{INN}) \qquad \text{Equation (2)}$$

To select an optimum trigger point, the following may be considered. For example, for a valid gain, $A_V$ options may include 10, 15, 20, 30, 40, 50, 70, and 100, among other possible values. Furthermore, valid $V_{REF}$ values may range from 1.3V to 1.93V in steps of 10 mV. To select a particular $V_{REF}$, a customer may round $V_{OUT1}$ to the nearest tens of millivolts (mV). For instance, if a $V_{SENSE}$ target is 25.2 mV and a gain of 60 is selected, then $V_{OUT1}$=60(25.2)=1.512V and $V_{REF}$=1.51V. With the combination of gain and reference voltage choices, the $V_{SENSE}$ covered range may be from 13 mV to 193 mV (i.e. 1.3/100=13 mV, 1.93/10=193 mV). There may exist gaps in the coverage.

Accuracy of a selected VREF value based on a corresponding $V_{SENSE}$ may be expressed as an error percentage as shown in Equation (3):

$$\%\ \text{Error} = 100\left(\left(\frac{\text{Vios1\_E\_Trim}}{V_{SENSE}}\right)+\left(0.005+\frac{(A_V-65)^2}{250{,}000}\right)+\left(\frac{\text{Vios2\_E\_Native}}{A_V V_{SENSE}}\right)\right)+\text{Vref\_E\_Trim} \qquad \text{Equation (3)}$$

The percentage error may depend on the values of the parameters of Equation (3). For example, higher values of $V_{SENSE}$ may produce lower sense error values. Furthermore, the gain value ($A_V$) may be at an optimum point in the middle of the gain selection range.

Figure 6:
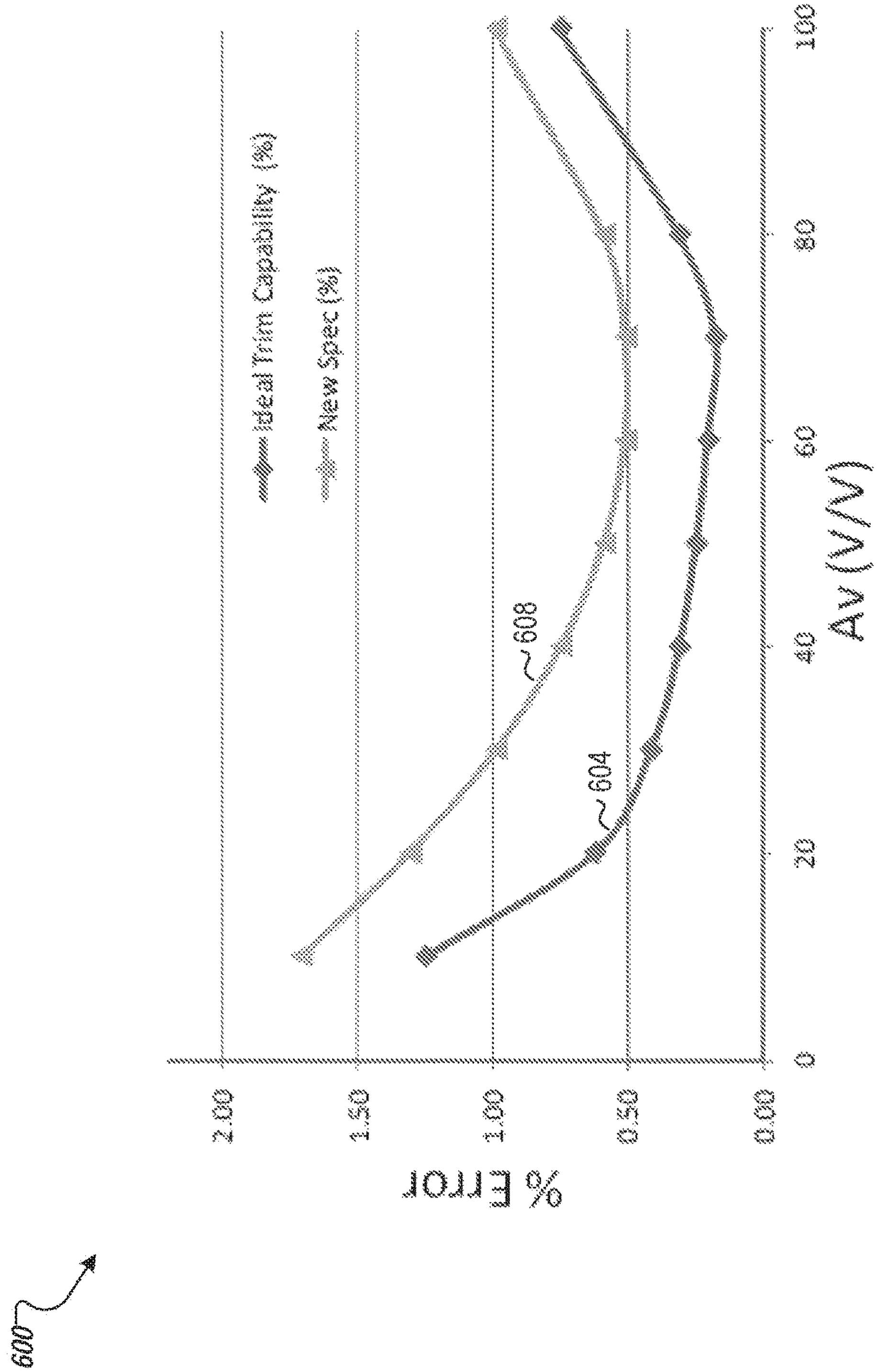
FIG. 6 illustrates a set of waveforms indicative of a percentage of trim error when ideal is compared with the present design, according to one embodiment.

FIG. 6 illustrates a set of waveforms 600 indicative of a percentage of trim error when ideal is compared with the present design, according to one embodiment. In FIG. 6, for ideal trim capability, the maximum error possible using trim under ideal conditions is represented by curve 604. The curve 608, however, represents a production test limit for post-production gain trim. The expression for the curve 608 is shown in Equation (3) as the second term. Example error rates for the first stage 110, the second stage 140, and for the overall total error of the OCD 100, according to Equation (3), is displayed in the data sheet 700 of FIG. 7 according to one embodiment.

FIG. 8 is a block diagram of a system 800 in which the current-sense detector circuit 100 is employed in the context of a Universal Serial Bus (USB) connector device 810, according to one embodiment. The USB connector device 810 may be coupled to an electrical device 812 that includes a processor 814, for executing software instructions, and a memory 816, for storing the instructions and other data. The electrical device 812 may be a host system or a powered electrical device connected to such a host system.

In one embodiment, the system 800 may further include an AC adapter 820 to provide primary side AC-to-DC power conversion. A voltage bus ($V_{BUS}$) is coupled between the USB connector device 810 and the AC adapter 820. The system 800 may further include a sense resistor ($R_{SENSE}$) and a pair of serially-connected power switches such as FETs 824A and 824B attached inline to the voltage bus.

Inputs (inp, inn) of the OCD 100 circuit may be coupled to either side of the sense resistor to sense a current.

In one embodiment, The OCD 100 may be a part of a CCG (USB Type-C Controller Generation #) controller 830, a highly integrated USB™ Type-C controller that complies with the latest USB Type-C and Power Delivery (PD) standards, and is made by Cypress Semiconductor of San Jose, Calif. The CCG controller 830 (which may be a CCG3 or CCG4 controller, for example) may provide a complete USB Type-C and USB-Power Delivery port control solution for notebooks, dongles, monitors, docking stations, power adapters, and the like.

The CCG controller 830 may further include a controller 834 coupled between the OCD 100 and a gate driver 836. The gate driver 836 may be coupled to and for driving the power FETs 824A and 824B. In one embodiment, the controller 834 may receive an interrupt signal from the OCD 100, and in response, decide to turn off the power FETs 824A and 824B, followed by triggering the gate driver 836 to turn off the power FETs. In an alternative embodiment, the interrupt signal from the OCD 100 directly triggers the gate driver 836 to turn off the power FETs. The USB connector device 810 may further include a configuration channel (CC) 801 that communicates with the CCG controller 830 as will be explained.

The USB™ Power Delivery Specification is an industry standard added to the existing USB™ definition that is used to establish $V_{bus}$ power delivery contracts between hosts and devices. This PD Specification specifies $V_{bus}$ power supply options that include a 5V to 20V voltage range and a configurable current source capability that supports a range of 500 mA to 5 A. For USB™ Type-C, current limits of 1.5 A and 3 A are defined. There may be no discrete limits defined for the level of current delivered between 3 A and 5 A. To protect against over-current draw, the sense resistor ($R_{sense}$) is installed at the $V_{bus}$ highside (e.g., the power supply source connection within a host or hub) to allow the CSA 114 and the comparator 150 (FIGS. 1, 2A, 2B, and 3) to produce a system interrupt.

In one embodiment, the gate driver 836 may drive the system interrupt to disconnect the power supply source (from the AC adapter 820) at the power FETs 824A and 824B, to protect USB™ system circuitry and cable connections, where cables are rated at 500 mA, 3 A and 5 A. The control block 834 may add a layer of control to processing of the system interrupt before the system interrupt is sent to the gate driver 836 to execute the disconnect from the power supply source. With the multiple current limits and the configurable nature of the high current range, a single USB Type-C connector device used for any application would need to be flexible so that the detected current limit corresponds to the appropriate limit defined by the application of the USB Type-C connector device.

With additional reference to FIGS. 1, 2A, 2B, and 3, during a production test process, a testing device may use software to cancel effects from the input offset voltages, $V_{ios1}$ and $V_{ios2}$, of the CSA 114 and the comparator 150, respectively. In one embodiment, during the test process, the ADFT circuit 120 may measure these offset voltages ($V_{ios1}$ and $V_{ios2}$). Also, the ADFT circuit 120 may facilitate an accurate measurement of the gain values of the CSA 114 in the first stage 110, as previously discussed. Now suppose a need to detect a particular value for $V_{SENSE}$, which will be called $V_{det}$. Given this known $V_{det}$, then the CSA 114 may be accurately measured to determine a gain, $A_V$. Further assuming a zero offset voltage for both the input offset voltages ($V_{ios1}$, $V_{ios2}$), then the first stage output may be expressed as $V_{out1}=A_V*V_{det}$. A value of the reference voltage ($V_{ref}$) may also be set to the same value, e.g., $Vref=A_V*V_{det}$. In this case, when the sense voltage increases slightly, say to $V_{SENSE}=(A_V*V_{det}+\Delta)$, then the output of the comparator 150 in the second stage 140 may go from low to high, and an over-voltage, corresponding to an over-current condition, is detected.

Further, consider a situation where there is non-zero input offset voltages, $V_{ios1}$ and $V_{ios2}$. When $V_{SENSE}=V_{det}$, then $V_{out1}=A_V(V_{det}+V_{ios1})$. If the software sets the reference to the previous value of $Vref=A_V*V_{det}$, then $V_{out1}>V_{ref}$, and hence, the OCD 100 may erroneously detect an over-current condition because of the $A_V V_{ios1}$ offset factor on $V_{out1}$. There may also be an added factor of $V_{ios2}$ from the input offset voltage of the comparator 150. Using a software-based method, the testing device may execute instructions to reduce the value of these effects, in which an updated value for $V_{ref}$ may be communicated to the OCD 100 by way the reference voltage selector signal ($V_{ref\_sel}$).

In one embodiment, the testing device may first calculate a change in reference voltage as the sum of the gain of the CSA times the first input offset voltage and the second input offset voltage, or $\Delta V_{ref}=A_V V_{ios1}+V_{ios2}$. For the reference voltage generator circuitry 144 in which 10 mV is the difference between successive bits, the testing device may determine the number of bits to add to the initial $V_{ref}$ value, which may be expressed as $$\Delta\text{Bits}=int[(A_V V_{ios1}+V_{ios2})/10\text{ mV}], \quad \text{Equation (4)}$$

where "int" represents the rounded integer value for the result. Thus, $V_{ref\_sel}$ may be expressed as:

$$V_{ref\_sel}=V_{ref\_sel}+\Delta\text{Bits}. \quad \text{Equation (5)}$$

After the production tests have been carried out and product distributed to a customer, the customer may carry out post-production trim to adjust for sources of errors not accounted for in the above testing-based adjustments. The main source of error accounted for is the inaccuracy of the sense resistor, or $R_P$ in FIGS. 1, 2A, and 2B. For the different gain values, the OCD 100 can be calibrated to select the $V_{ref}$ value that triggers the comparator 150 in the second stage 140. An array may be created for $V_{ref}$ values mapped to particular gain values. Other factors that affect the accuracy of the CSA 114, for example, such as temperature variation, may be added as discussed with reference to FIG. 9C. Finally, the electrical device 812 may create a lookup table that can be referenced to determine $V_{ref\_sel}$, in order to update $V_{ref}$ appropriately for each of the operating condition.

Figure 9A:
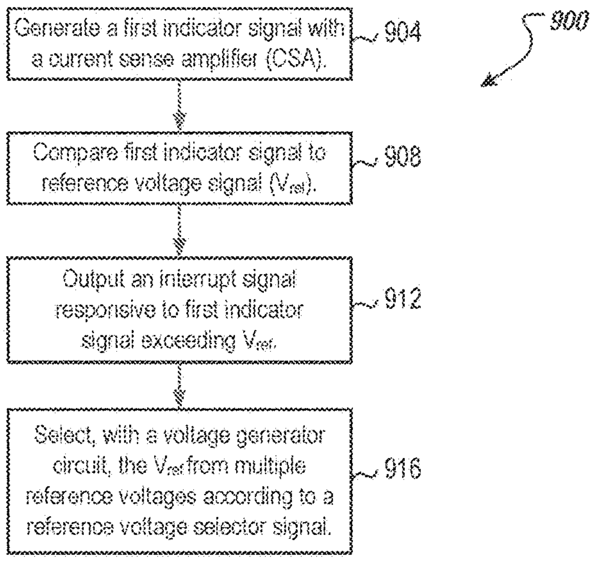
FIG. 9A is a flow diagram illustrating a method of post-production selection of a reference voltage from a plurality of reference voltages, according to one embodiment.

FIG. 9A is a flow diagram illustrating a method 900 of post-production selection of a reference voltage from a plurality of reference voltages, according to one embodiment. The method may be performed by the over-current detector (OCD) circuit 100 of FIG. 1, for example. The method 900 may begin by the CSA 114 generating a first indicator signal based on a current level sensed flowing through a sense resistor of a voltage bus (904). The method 900 may continue by a comparator comparing the first indicator signal to a reference voltage signal ($V_{ref}$) (908). The method 900 may continue by the comparator outputting an interrupt signal responsive to the first indicator signal exceeding the reference voltage signal (912). The method 900 may continue with a voltage generator circuit selecting the reference voltage signal from a plurality of reference voltages according to a reference voltage selector signal received from a configuration channel of a USB connector device or other type of electrical connector (916).

Figure 9B:
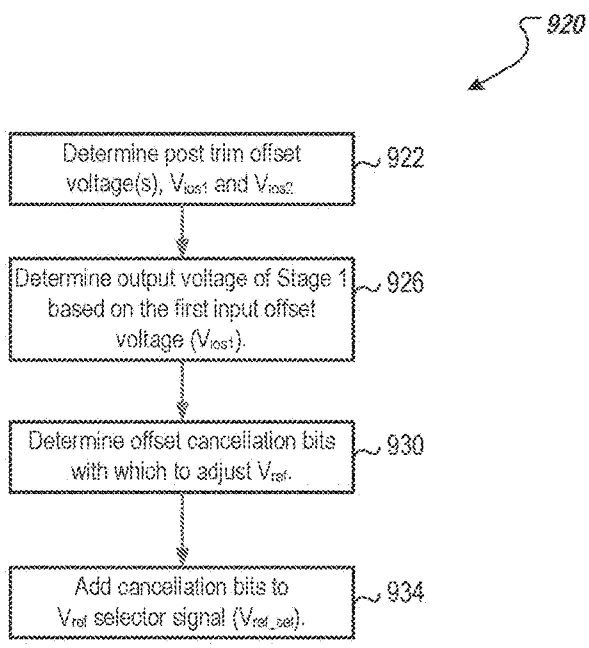
FIG. 9B is a flow diagram illustrating a method of post-production trim of the reference voltage selected as in FIG. 9A, according to one embodiment.

FIG. 9B is a flow diagram illustrating a method 920 of post-production trim of the reference voltage selected as in FIG. 9A, according to one embodiment. The method may be performed by a testing device, which may be the electrical device 812 in one embodiment. The method 920 may begin with determining the input offset voltages, $V_{ios1}$ and $V_{ios2}$, after trim bits have been included in the OCD design (922). The method 920 may continue by determining a first stage output voltage ($V_{out1}$) based on the output gain of the CSA 114 and the first input offset voltage, e.g., $V_{out1}=A_V(V_{det}+V_{ios1})$ (926).

In one embodiment, the AFDT 120 may be used to measure the input offset voltages and gain values. The method 920 may continue by determining a set of offset cancellation bits with which to adjust the reference voltage signal ($V_{ref}$), e.g., calculating Equation (4) (930). The method 920 may continue by adding the cancellation bits to the reference voltage selector signal ($V_{ref\_sel}$), e.g., by calculating Equation (5), to generate an updated reference voltage selector signal (block 934).

Figure 9C:
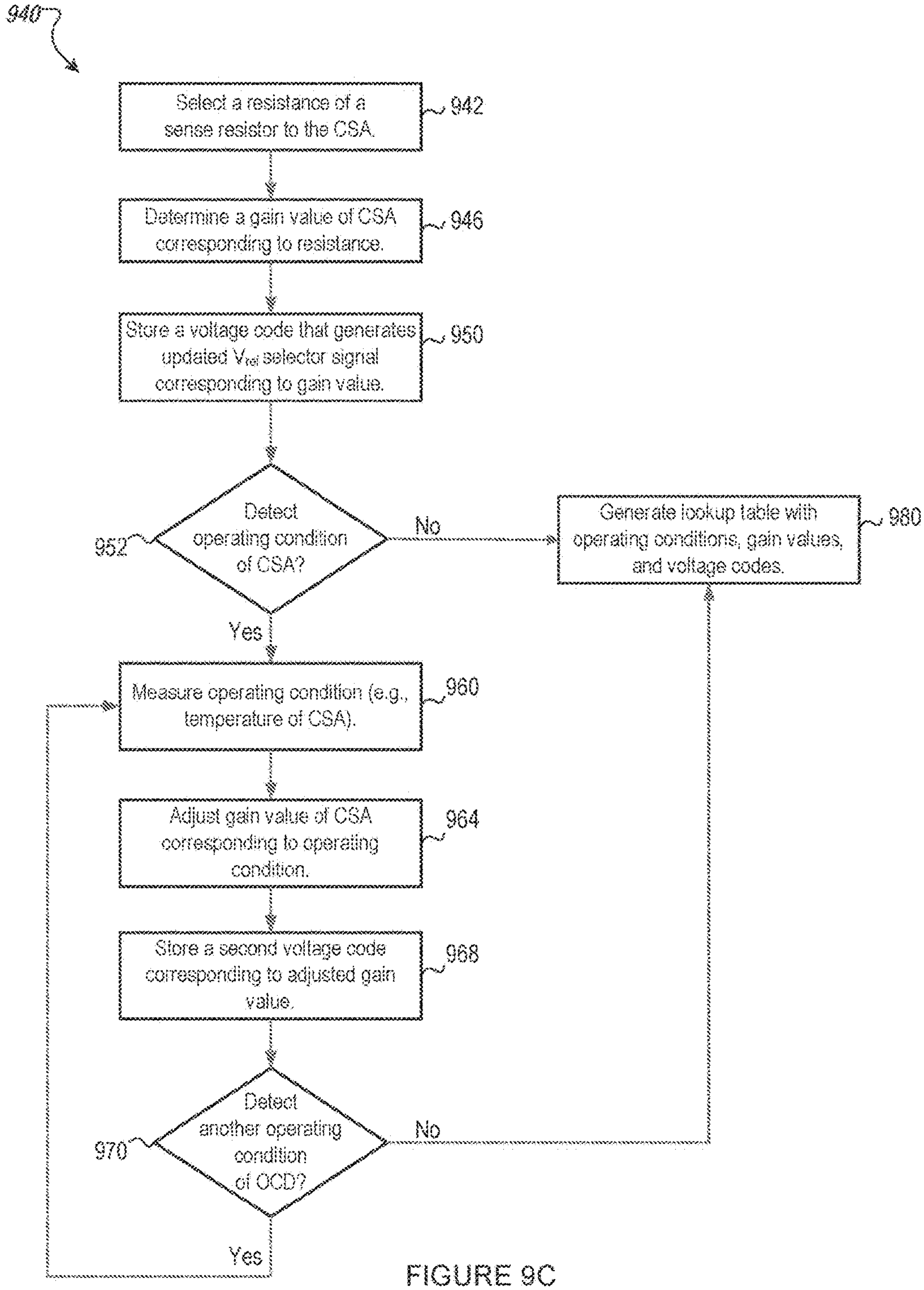
FIG. 9C is a flow diagram illustrating a method of post-production trim of the reference voltage updated as in FIG. 9B, to account for additional operation conditions, according to another embodiment.

FIG. 9C is a flow diagram illustrating a method 940 of post-production trim of the reference voltage updated as in FIG. 9B, to account for additional operation conditions, according to another embodiment. The method may be performed by instructions executed by the electrical device 812 in conjunction with measurements obtained from the ADFT circuit 120 (FIG. 1), and operating conditions detected by way of sensors and/or a variation of operation parameters detected in operating characteristics of the OCD 100.

Accordingly, in one embodiment, the method 940 may begin by selecting a resistance of the sense resistor, $R_P$ (FIGS. 1, 2A, 2B), which may be provided by a variable resistor for example (block 942). The method 940 may continue by using the ADFT circuit 120 to determine a gain value, $A_V$, of the CSA 114 corresponding to the selected resistance (946). The method 942 may continue by storing a voltage code that generates the updated reference selector signal (determined in block 934 of FIG. 9B) corresponding to the determined gain value (950). In one embodiment, the updated reference selector signal corresponding to the voltage code may put the $V_{ref}$ value within the middle of a reference voltage range for the OCD 100 triggering an interrupt signal for a particular application of the OCD 100 or the CCG controller 830.

The method 940 may continue by determining whether an operating condition of the CSA 114 is detected (952). If the answer is no, the method 940 may continue by generating a lookup table with gain values mapped to voltage codes that may be used by the electrical device 812 to determine the reference voltage selector signal based on a measured gain value ($A_V$) (980).

If the answer is yes to the inquiry of block 952, the method 940 may continue with the ADFT circuit 120 measuring an operating condition (e.g., a temperature of the CSA 114) (960). The method 940 may continue by adjusting a gain value of the CSA 114 corresponding to the operating condition, to generate an adjusted gain value of the CSA 114 (964). The method 940 by continue by storing a second voltage code corresponding to the adjusted gain value in an array in memory, where the second voltage code is stored in relation to the adjusted gain value (968). The method 940 may continue by detecting another operating condition of the CSA 114 or of the comparator 150 of the OCD 100 (970). If no additional operating condition is detected, the method 940 may continue by generating a lookup table mapping a plurality of corresponding operating conditions, gain values, and voltage codes that may be used by the electrical device 812 to determine the reference voltage selector signal based on a measured gain value ($A_V$) (980). If an additional operating condition is detected, the method 940 may continue to block 960 to repeat blocks 960, 964, and 968 for the additional operating condition.

In various embodiments, the CCG controller 830 may reside on a common carrier substrate such as, for example, an integrated circuit ("IC") die substrate, a multi-chip module substrate, or the like. Alternatively, the components of the CCG controller 830 may be one or more separate integrated circuits and or discrete components. In one exemplary embodiment, the CCG controller 830 is the Programmable System on a Chip (PSoC®) processing device, developed by Cypress Semiconductor Corporation, San Jose, Calif. Alternatively, CCG controller 830 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like.

It should also be noted that the embodiments described herein are not limited to having a configuration of a processing device coupled to an application processor, but may include a system that measures a signal indicative of the capacitance on the sensing device and sends the raw data to a host computer where it is analyzed by an application. In effect, the processing that is done by CCG controller 830 may also be done in the application processor.

The OCD 100 may be integrated into the IC of the CCG controller 830, or alternatively, in a separate IC. Alternatively, descriptions of the OCD 100 may be generated and compiled for incorporation into other integrated circuits. For example, behavioral level code describing the OCD 100, or portions thereof, may be generated using a hardware descriptive language, such as VHDL or Verilog, and stored to a machine-accessible medium (e.g., CD-ROM, hard disk, floppy disk, etc.). Furthermore, the behavioral level code may be compiled into register transfer level ("RTL") code, a netlist, or even a circuit layout and stored to a machine-accessible medium. The behavioral level code, the RTL code, the netlist, and the circuit layout may represent various levels of abstraction to describe the OCD 100.

It should be noted that the components of the system 800 may include all the components described above. Alternatively, the system 800 may include some of the components described above. In one embodiment, the system 800 is used in a tablet computer. Alternatively, the electronic device may be used in other applications, such as a notebook computer, a mobile handset, a personal data assistant ("PDA"), a keyboard, a television, a remote control, a monitor, a handheld multi-media device, a handheld media (audio and or video) player, a handheld gaming device, a signature input device for point of sale transactions, an eBook reader, global position system ("GPS") or a control panel.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium;

read-only memory (ROM); random-access memory (RAM); erasable programmable memory (e.g., EPROM and EEPROM); flash memory; or another type of medium suitable for storing electronic instructions.

Additionally, some embodiments may be practiced in distributed computing environments where the machine-readable medium is stored on and or executed by more than one computer system. In addition, the information transferred between computer systems may either be pulled or pushed across the communication medium connecting the computer systems.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and or alternating manner. The terms "first," "second," "third," "fourth," etc. as used herein are meant as labels to distinguish among different elements and may not necessarily have an ordinal meaning according to their numerical designation. As used herein, the term "coupled" may mean connected directly or indirectly through one or more intervening components. Any of the signals provided over various buses described herein may be time multiplexed with other signals and provided over one or more common on-die buses. Additionally, the interconnection and interfaces between circuit components or blocks may be shown as buses or as single signal lines. Each of the buses may alternatively be one or more single signal lines and each of the single signal lines may alternatively be buses.

The above description sets forth numerous specific details such as examples of specific systems, components, methods, and so forth, in order to provide an understanding of several embodiments of the present invention. It may be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

What is claimed is:

1. A device comprising:
- a gate driver configured to control a power switch on a voltage bus (VBUS) line of a universal serial bus (USB) connector; and
- a current detector circuit configured to couple to the VBUS line, the current detector circuit comprising:
  - a current sense amplifier configured to receive a pair of input voltages and to output an indicator signal responsive to an input voltage difference that is sensed based on the pair of input voltages;
  - a reference voltage generator circuit comprising a digital-to-analog converter and configured to receive a voltage selector signal, wherein the digital-to-analog converter is configured to generate a reference voltage signal based on the voltage selector signal, and wherein the voltage selector signal is a binary input signal comprising multiple bit values; and
  - a comparator coupled to the current sense amplifier and to the reference voltage generator circuit, wherein the comparator is configured to receive the indicator signal and the reference voltage signal and to output an interrupt signal responsive to the indicator signal exceeding the reference voltage signal.

2. The device of claim 1, wherein the digital-to-analog converter is configured to generate the reference voltage signal to correspond to any of a plurality of reference voltages indicated by the voltage selector signal.

3. The device of claim 1, wherein the digital-to-analog converter comprises a bank of multiple voltage dividers, wherein the multiple voltage dividers are respectively activated based on the multiple bit values of the binary input signal.

4. The device of claim 1, wherein the digital-to-analog converter comprises a bank of multiple resistors of varying resistance, wherein the multiple resistors are respectively selected based on the multiple bit values of the binary input signal.

5. The device of claim 1, wherein the digital-to-analog converter comprises a decoder, a series of resistors, an analog output, and a buffer coupled between the analog output and the series of resistors; and wherein the decoder is configured to select any number of resistors from the series of resistors based on the multiple bit values of the binary input signal, and the buffer is configured to generate the reference voltage signal at the analog output as a sum of voltage drops across the selected number of resistors.

6. The device of claim 1, further comprising a controller coupled to the current detector circuit and to the gate driver, the controller configured to receive the interrupt signal from the current detector circuit and to trigger the gate driver.

7. The device of claim 1, wherein in a continuous mode of operation, the comparator is configured to continuously track the input voltage difference versus a voltage of the reference voltage signal.

8. The device of claim 1, wherein in a latched mode of operation, the comparator is configured to reset itself after the interrupt signal is output.

9. The device of claim 1, wherein the voltage selector signal is received from a configuration channel line of the USB connector.

10. The device of claim 9, wherein the current sense amplifier is configured to receive a programmable trim signal from the USB connector.

11. A system comprising:
- a universal serial bus (USB) connector comprising a voltage bus (VBUS) line;
- a power switch coupled inline on the VBUS line and configured to turn off in response to an interrupt signal;
- a sense resistor coupled in series with the power switch on the VBUS line; and
- a current detector circuit coupled to the VBUS line, the current detector circuit comprising:
  - a current sense amplifier configured to sense an input voltage difference across the sense resistor and to output an indicator signal responsive to the input voltage difference;
  - a reference voltage generator circuit comprising a digital-to-analog converter and configured to receive a voltage selector signal, wherein the digital-to-analog converter is configured to generate a reference voltage signal based on the voltage selector signal, and wherein the voltage selector signal is a binary input signal comprising multiple bit values; and
  - a comparator coupled to the current sense amplifier and to the reference voltage generator circuit, wherein the comparator is configured to receive the indicator signal and the reference voltage signal and to output the interrupt signal responsive to the indicator signal exceeding the reference voltage signal.

12. The system of claim 11, wherein the digital-to-analog converter is configured to generate the reference voltage signal to correspond to any of a plurality of reference voltages indicated by the voltage selector signal.

13. The system of claim 11, wherein the digital-to-analog converter comprises a bank of multiple voltage dividers, wherein the multiple voltage dividers are respectively activated based on the multiple bit values of the binary input signal.

14. The system of claim 11, wherein the digital-to-analog converter comprises a bank of multiple resistors of varying resistance, wherein the multiple resistors are respectively selected based on the multiple bit values of the binary input signal.

15. The system of claim 11, wherein the digital-to-analog converter comprises a decoder, a series of resistors, an analog output, and a buffer coupled between the analog output and the series of resistors; and wherein the decoder is configured to select any number of resistors from the series of resistors based on the multiple bit values of the binary input signal, and the buffer is configured to generate the reference voltage signal at the analog output as a sum of voltage drops across the selected number of resistors.

16. The system of claim 11, further comprising:

a gate driver coupled to drive the power switch; and a controller coupled to the current detector circuit and to the gate driver, the controller configured to receive the interrupt signal from the current detector circuit and to trigger the gate driver.

17. The system of claim 11, wherein in a continuous mode of operation, the comparator is configured to continuously track the input voltage difference versus a voltage of the reference voltage signal.

18. The system of claim 11, wherein in a latched mode of operation, the comparator is configured to reset itself after the interrupt signal is output.

19. The system of claim 11, wherein the USB connector comprises a configuration channel line, and wherein the voltage selector signal is received from the configuration channel line.

20. The system of claim 11, further comprising an AC adapter and an electronic device, wherein the electronic device is coupled to the AC adapter over the USB connector.

* * * * *